(12) United States Patent
Terada et al.

(10) Patent No.: US 6,670,105 B2
(45) Date of Patent: Dec. 30, 2003

(54) METHOD OF MANUFACTURING DIFFRACTIVE OPTICAL ELEMENT

(75) Inventors: Junji Terada, Tokyo (JP); Masaaki Nakabayashi, Yokohama (JP); Senichi Hayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/398,009

(22) Filed: Sep. 17, 1999

(65) Prior Publication Data
US 2003/0044728 A1 Mar. 6, 2003

(30) Foreign Application Priority Data

Sep. 18, 1998 (JP) .......................................... 10-283446
Feb. 17, 1999 (JP) .......................................... 11-038670

(51) Int. Cl.[7] ............................................. G02B 5/18
(52) U.S. Cl. ...................... 430/320; 430/321; 216/24; 216/60
(58) Field of Search ................ 430/321, 320; 216/60, 24; 359/568, 563, 575

(56) References Cited

U.S. PATENT DOCUMENTS

| | | | | |
|---|---|---|---|---|
| 3,911,479 A | * | 10/1975 | Sakurai | 359/575 |
| 4,155,627 A | * | 5/1979 | Gale et al. | 359/568 |
| 4,944,838 A | * | 7/1990 | Koch et al. | 156/652 |
| 5,156,943 A | * | 10/1992 | Whitney | 430/321 |
| 5,278,028 A | * | 1/1994 | Hadimioglu et al. | 430/321 |
| 5,300,379 A | * | 4/1994 | Dao et al. | 430/321 |
| 5,502,707 A | * | 3/1996 | Komma et al. | 359/575 |
| 5,538,674 A | * | 7/1996 | Nisper et al. | 264/1.31 |
| 5,578,536 A | | 11/1996 | Kameyama et al. | 501/103 |
| 5,589,303 A | * | 12/1996 | DeMarco et al. | 430/5 |
| 5,600,486 A | * | 2/1997 | Gal et al. | 359/568 |
| 5,759,724 A | * | 6/1998 | Rolson et al. | 430/5 |
| 5,777,335 A | | 7/1998 | Mochizuki et al. | 250/370.09 |
| 5,777,780 A | | 7/1998 | Terada et al. | 359/273 |
| 5,831,760 A | | 11/1998 | Hashimoto et al. | 359/273 |
| 6,021,106 A | * | 2/2000 | Welch et al. | 264/1.31 |

FOREIGN PATENT DOCUMENTS

| | | | | |
|---|---|---|---|---|
| EP | 0629592 | * | 12/1994 | |
| JP | 2-58510 | | 2/1990 | |
| JP | 06-043311 | * | 2/1994 | 359/563 |
| JP | 6-258510 | | 9/1994 | |
| JP | 08-015510 | * | 1/1996 | |
| JP | 9-54420 | | 2/1997 | |

OTHER PUBLICATIONS

IBM Tech. Dicl. Bull., vol. 36(6a), pp. 523–526, Jun. 1993.*
Abstract and Machine translation of Miyashita et al. JP 09–054420.*

* cited by examiner

*Primary Examiner*—Martin Angebranndt
(74) *Attorney, Agent, or Firm*—Fitzpatrick, Cella, Harper & Scinto

(57) ABSTRACT

A method of manufacturing a micro-structure having a plurality of step-like elements, includes the steps of etching a first region of a substrate, corresponding to a lowest step of the step-like element, with an appropriate depth, whereby a surface of the lowest step of the step-like element is defined, and etching, subsequently, a second region of the substrate, corresponding to another step of the step-like element, with an appropriate depth, whereby a surface of that step of the step-like element is defined.

12 Claims, 9 Drawing Sheets

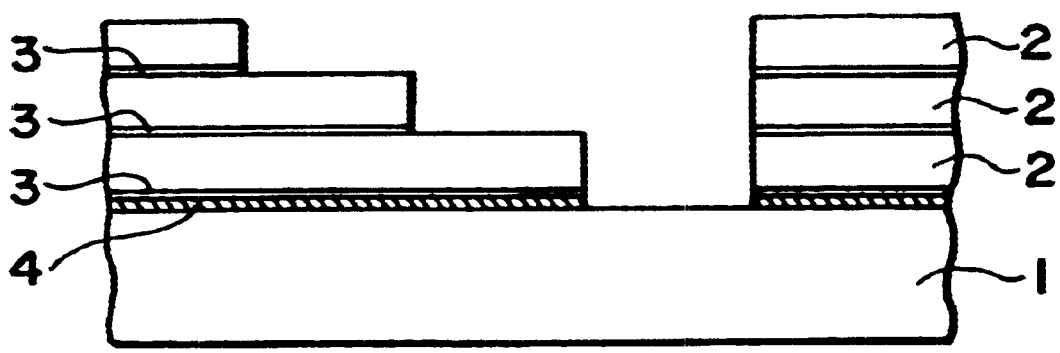
F I G. 1
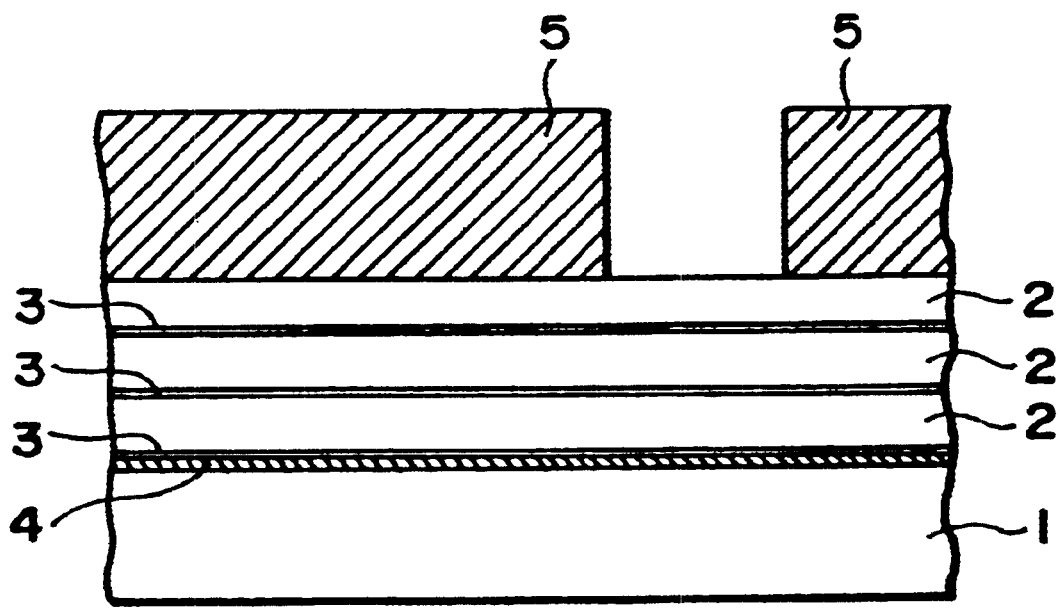
F I G. 2

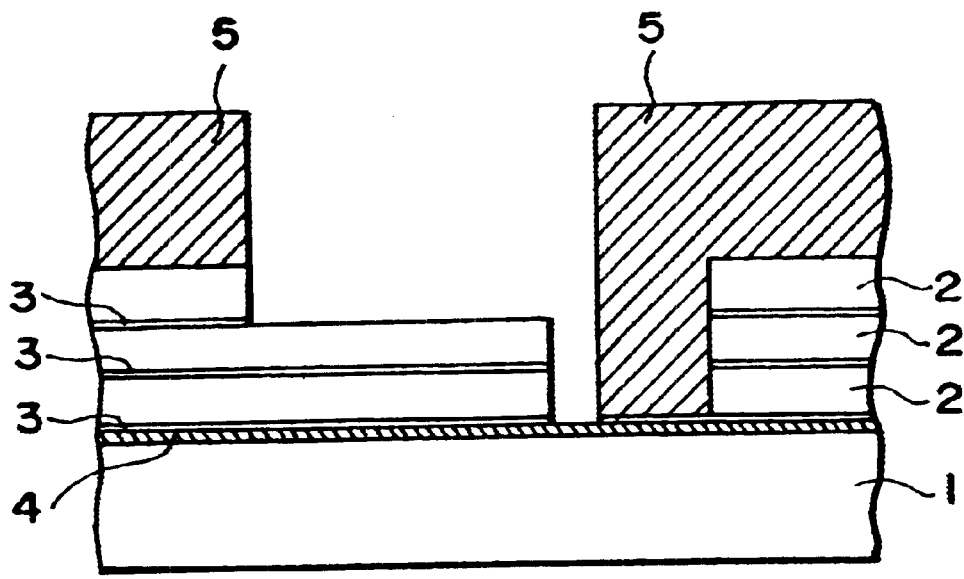
F I G. 5
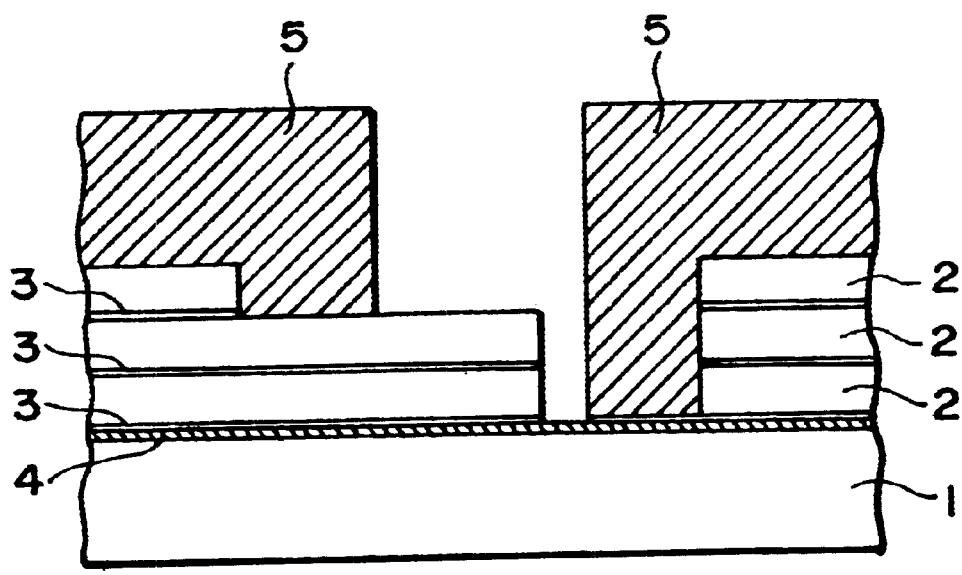
F I G. 6

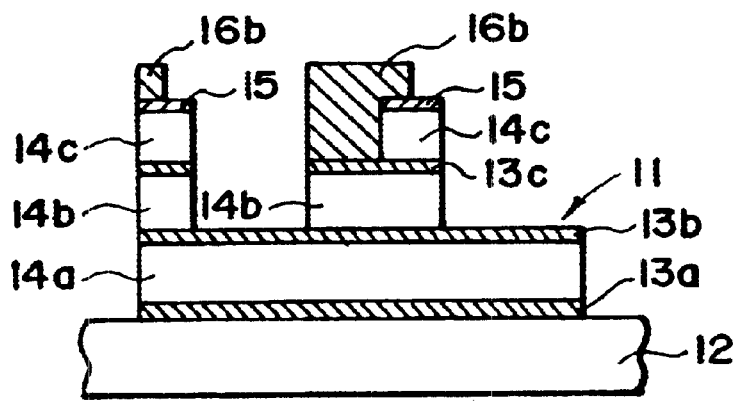
F I G. 15
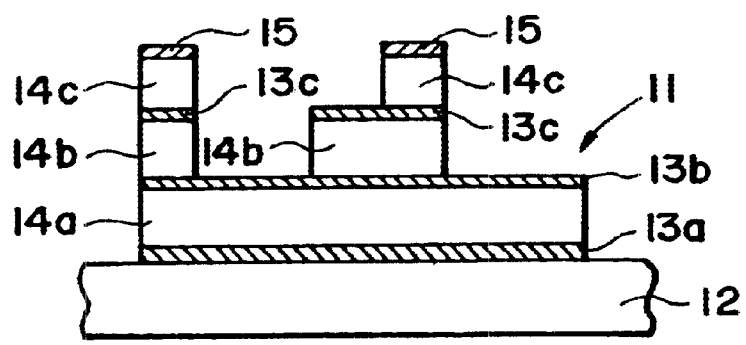
F I G. 16
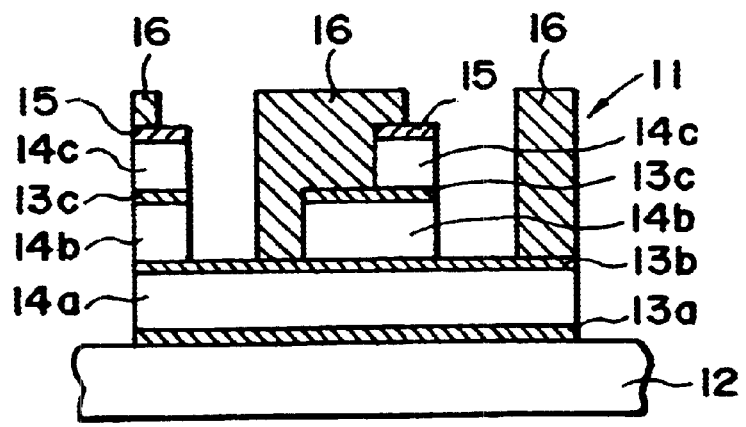
F I G. 17

METHOD OF MANUFACTURING DIFFRACTIVE OPTICAL ELEMENT

BACKGROUND OF THE INVENTION

Field of the Invention and Related Art

This invention relates to a method of manufacturing a diffractive optical element.

A diffractive optical element is an optical element that uses a diffraction phenomenon of light, and it can be provided by a diffraction grating of various shapes and sizes. As an example, Japanese Laid-Open Patent Application, Laid-Open No. 258510/1994 shows a diffractive optical element with a diffraction grating having a step-like sectional shape. This diffractive optical element is formed by alternately accumulating, upon a substrate, layers of two materials having different reaction characteristics, with respect to an etching gas, while their film thicknesses are precisely controlled. After this, a patterning operation and an etching operation are performed to the alternate layers of the two materials on the basis of photolithography, by which a diffraction grating of step-like shape is produced.

Where a diffraction grating having a step-like sectional shape is produced in accordance with the method disclosed in Japanese Laid-Open Patent Application, Laid-Open No. 258510/1994 mentioned above, if the patterning is performed three times in a superimposed fashion, an alignment error may occur between a step and a side wall facing it. If this occurs, the side wall may have a slope extending from the bottom of the step. That is, in the step-like structure, the side wall does not extend perpendicularly to the bottom.

Further, in accordance with the method of forming a diffraction grating as disclosed in Japanese Laid-Open Patent Application, Laid-Open No. 258510/1994 mentioned above, a resist is applied to a surface having a surface step as defined by the etching process, and then the subsequent patterning operation is performed. This causes the side wall of the patterned resist, particularly, the resist side wall of a lower step (smaller level difference), is easily affected by a wall on the opposite side, during the exposure operation, such that there occurs a tilt of the resist side wall relative to the bottom. As a result, the step-like shape to be defined by the subsequent etching process is formed with a similar tilt like the resist tile shape.

SUMMARY OF THE INVENTION

It is an object of the present invention to provide a method of manufacturing a micro-structure having an accurate step-like sectional shape.

It is another object of the present invention to provide a diffractive optical element with a diffraction grating having such a structure.

In accordance with a first aspect of the present invention, there is provided a method of manufacturing a micro-structure having a plurality of step-like elements, said method comprising: etching a first region of a substrate, corresponding to a lowest step of the step-like element, with an appropriate depth, whereby a surface of the lowest step of the step-like element is defined; and etching, subsequently, a second region of the substrate, corresponding to another step of the step-like element, with an appropriate depth, whereby a surface of that step of the step-like element is defined.

In accordance with a second aspect of the present invention, there is provided, a method of manufacturing a micro-structure having a plurality of step-like elements, said method comprising: forming, on a substrate, a film having a thickness corresponding to the height of the step-like element; etching a first region of the film on the substrate, corresponding to a lowest step of the step-like element, with an appropriate depth, whereby a surface of the lowest step of the step-like element is defined; and etching, subsequently, a second region of the film on the substrate, corresponding to another step of the step-like element, with an appropriate depth, whereby a surface of that step of the step-like element is defined.

In accordance with a third aspect of the present invention, there is provided a method of manufacturing a micro-structure having a plurality of step-like elements, said method comprising: forming, on a substrate, a film. having a thickness corresponding to the height of the step-like element; etching a first region of the film on the substrate, corresponding to a lowest step of the step-like element, with an appropriate depth, whereby a surface of the lowest step of the step-like element is defined; and etching, subsequently, a second region of the film on the substrate, corresponding to another step of the step-like element, with an appropriate depth, whereby a surface of that step of the step-like element is defined, wherein the film includes a multilayered film comprising alternate layers of two materials having different etching rates, and wherein each layer of one of the two materials having a higher etching rate serves as a main portion of the step-like element, while each layer of the other material having a lower etching rate serves as a stopper when the or each layer of the material of the higher etching rate is etched.

In accordance with a fourth aspect of the present invention, there is provided a method of manufacturing a micro-structure having a plurality of step-like elements, said method comprising: forming, on a substrate, a film having a thickness corresponding to the height of the step-like element; etching a first region of the film on the substrate, corresponding to a lowest step of the step-like element, with an appropriate depth, whereby a surface of the lowest step of the step-like element is defined; and etching, subsequently, a second region of the film on the substrate, corresponding to another step of the step-like element, with an appropriate depth, whereby a surface of that step of the step-like element is defined; wherein the film includes a multilayered film comprising alternate layers of two materials having different etching rates; wherein each layer of one of the two materials having a higher etching rate serves as a main portion of the step-like element while each layer of the other material having a lower etching rate serves as a first stopper layer when the or each layer of the material of the higher etching rate is etched; and wherein the film further includes a second stopper layer of a material having an etching rate lower than those of the two materials and being provided on a side of the multilayered film facing the substrate, the second stopper layer serving as a stopper when the two materials are etched.

In accordance with a fifth aspect of the present invention, there is provided a method of manufacturing a micro-structure having a plurality of step-like elements, said method comprising: etching a region of a substrate with an appropriate depth; and etching, subsequently, a surface defined by said etching and corresponding to a side wall of the step-like element.

In accordance with a sixth aspect of the present invention, there is provided a method of manufacturing a micro-structure having a plurality of step-like elements, said method comprising: etching a ' region of a substrate to provide a surface of a step of the step-like element; and etching, subsequently, a surface defined by said etching and corresponding to a side wall of the step-like element, to correct an angle of the surface corresponding to the side wall.

In accordance with a seventh aspect of the present invention, there is provided a method of manufacturing a micro-structure having a plurality of step-like elements, said method comprising: forming, on a substrate, a film having a thickness corresponding to the height of the step-like element; etching a region of the film of the substrate with an appropriate depth; and etching, subsequently, a surface defined by said etching and corresponding to a side wall of the step-like element, to correct an angle of the surface corresponding to the side wall; wherein the film includes a multilayered film comprising alternate layers of two materials having different etching rates; wherein each layer of one of the two materials having a higher etching rate serves as a main portion of the step-like element while each layer of the other material having a lower etching rate serves as a stopper when each layer of the material of the higher etching rate is etched; and wherein each layer of the one material having the higher etching rage is etched so that the or each layer of the other material having the lower etching rate is exposed, and thereafter the etching step for the correction of the angle of the surface corresponding to the side wall is performed while each layer of the material of the lower etching late is kept exposed.

In accordance with an eighth aspect of the present invention, there is provided a method of manufacturing a micro-structure having a plurality of step-like elements, said method comprising: forming, on a substrate, a film having a thickness corresponding to the height of the step-like element; and etching a region of the film of the substrate with an appropriate depth; wherein the film includes a multilayered film comprising alternate layers of two materials having different etching rates; wherein each layer of one of the two materials having a higher etching rate serves as a main portion of the step-like element while each layer of the other material having a lower etching rate serves as a stopper when each layer of the material of the higher etching rate is etched; and wherein each layer of the one material having the higher etching rage is etched until each layer of the other material having the lower etching rate is exposed, and thereafter a resist pattern is formed on the substrate where the lower etching rate material layer is exposed, wherein each layer of the lower etching rate material is etched by use of the resist pattern and, thereafter, each layer of the higher etching rate material below it is etched.

In a ninth aspect of the present invention, there is provided a method of manufacturing a diffractive optical element, including a process for forming a diffraction grating in accordance with the method corresponding to any one of the first to eights aspects of the present invention.

In a tenth aspect of the present invention, there is provided a method of manufacturing a diffractive optical element, including a process for forming a mold for a diffraction grating in accordance with the method corresponding to any one of the first to eights aspects of the invention, and for forming the diffraction grating, for the diffractive optical element, by using the mold.

In an eleventh aspect of the present invention, there is provided a method of manufacturing an optical system having a diffractive optical element, including a process for providing the diffractive optical element in accordance with the method corresponding to any one of the first to eights aspects of the invention.

In a twelfth aspect of the present invention, there is provided a method of manufacturing an optical system having a diffractive optical element, including a process for forming a mold for a diffraction grating in accordance with the method corresponding to any one of the first to eights aspects of the invention, and for providing the diffractive optical element by using the mold.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a sectional view of a diffractive optical element according to a first embodiment of the present invention.

FIGS. 2, 3, 4, 5, 6 and 7 are sectional views, respectively, for explaining manufacturing processes in the first embodiment of the present invention.

FIGS. 9, 10, 11, 12, 13, 14, 15, 16, 17, 18, 19, 20, 21 and 22 are sectional views, respectively, for explaining manufacturing processes for a diffractive optical element according to a third embodiment of the present invention.

DESCRIPTION OF THE PREFERRED EMBODIMENTS

Figure 3:
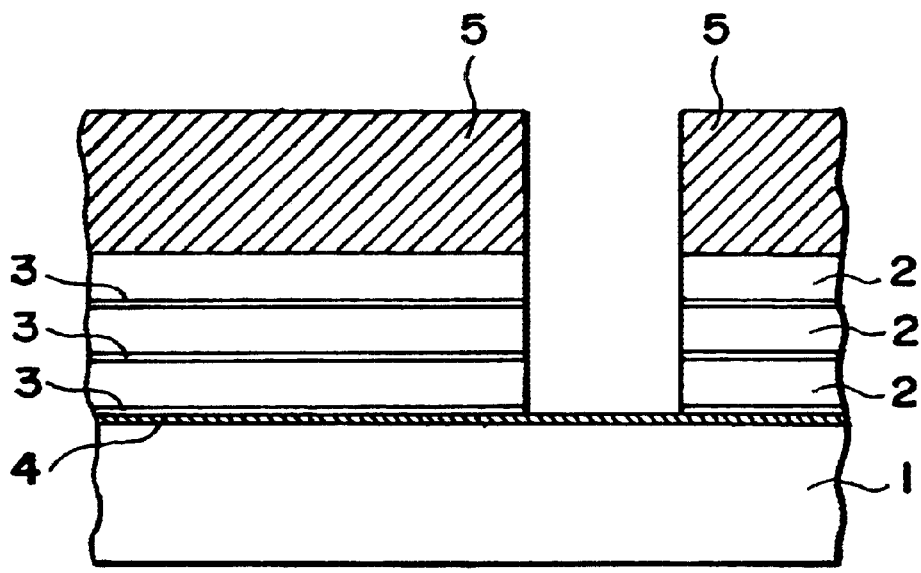

Preferred embodiments of the present invention will now be described with reference to the accompanying drawings.

FIG. 1 is a sectional view of a diffractive optical element having a four-level (four-stepped) step-like shape, according to a first embodiment of the present invention. Upon a substrate 1 made of an optical glass, a metal or a synthetic resin, there are sputtering films (etching films) 2 for defining steps through the etching operation, and etching stopper layers 3 being operable as etching stoppers for the respective levels (steps), which are alternately accumulated on the substrate 1. Disposed between the substrate 1 and the etching stopper layer 3 at the bottom layer of the alternate accumulation film, is a second etching stopper layer 4.

In this embodiment, a silicon (Si) wafer is used for the substrate 1, and a $SiO_2$ film is used for each layer 2 of the alternate accumulation film to be formed on the surface of the substrate 1. Each of the layers 2 is formed with a thickness of 600 nm, by using a usual sputtering film forming apparatus. With regard to layers 3, an $Al_2O_3$ film having an etching rate different from that of the $SiO_2$ film is used. Each layer 3 is formed with a thickness of 10 nm, by using a similar sputtering film forming apparatus. The second etching stopper layer 4 comprises a metal film or a dielectric material film having a very slow etching rate with respect to an etching gas that is used for the etching of the sputtering layers 2 and the stopper layers 3. As an example, a $Cr_2O_3$ film may be used. The $Cr_2O_3$ film may be formed between the substrate 1 and the bottom layer of the etching stopper layer 3, in accordance with a usual vacuum film forming method, for example.

FIGS. 2 through 7 are sectional views, respectively, for explaining manufacturing processes.

Initially, a substrate 1 having a diameter of 8 inches and having been cleaned sufficiently is placed in a sample holder inside a casing, so that the surface thereof on which the film is to be formed faces a target of the sputtering apparatus.

Then, the casing is sufficiently vacuum evacuated and, after that, an oxygen gas and an argon gas are introduced into the casing, with the inside pressure being set to 2 Pa. A high frequency wave of an output 400 W is applied from an RF voltage source to an electrode, by which a second etching stopper layer ($Cr_2O_3$ film) 4 is uniformly formed on the surface, with a thickness 100 nm. After this film formation, the vacuum within the casing is once released, and the sample is placed into a heating high-temperature oven so that annealing is performed at 900 degrees and for 2 hours.

After the sample is sufficiently cooled, it is loaded again on the sputtering apparatus in the same manner. The target is replaced by Al and, after the mixture ratio of the oxygen gas and the argon gas is adjusted to 1:1, a first etching stopper layer 3 is uniformly formed on the second etching stopper layer 4, having been processed by annealing, with a thickness of 10 nm. Then, without releasing the vacuum, the target is replaced by $SiO_2$ and, after adjusting the mixture ratio of the oxygen gas and the argon gas to 1:10, a sputtering layer 2 is formed uniformly on the surface of the etching stopper layer 3, with a thickness of 600 nm. Subsequently, alternate layers of a layer 2 and a layer 3 is formed thereon twice, whereby an accumulation film comprising six layers is formed on the second etching stopper layer 4.

To a sample thus provided, a photoresist 5 being patterned is used to produce a step-like shape with four levels (steps) by etching. In FIG. 2, a photoresist 5 is formed on the alternate accumulation film by using a spinner, and a patterning of a width of 1 micron, corresponding to the fourth level (step), is exposed and then developed.

Figure 4:
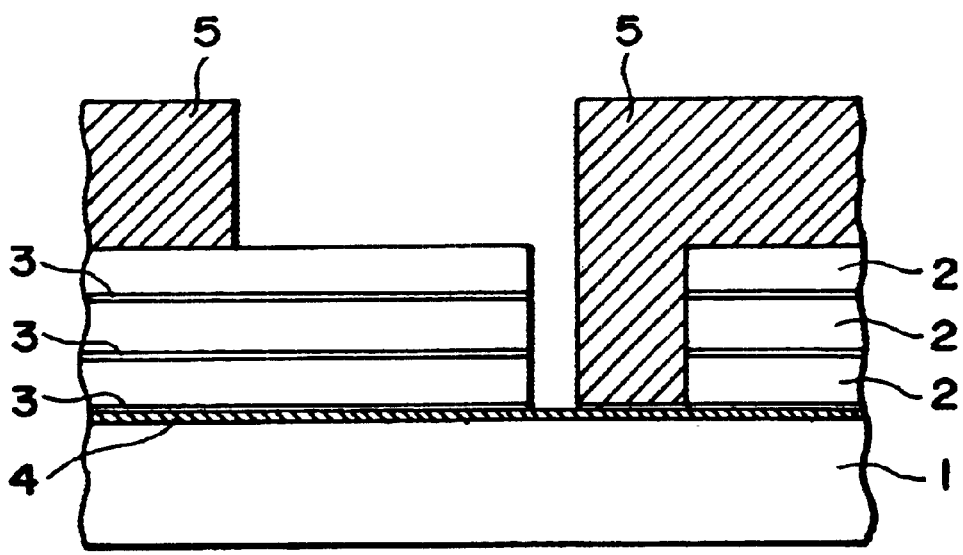

Subsequently, this sample is loaded on an electrode of a usual RIE etching apparatus so that the surface with film can be etched. After sufficient vacuum evacuation, an etching gas of $CF_4$ and $CHF_3$ is introduced, and the pressure in side the casing is adjusted to 1 Pa. A voltage of output 100 W is applied to the electrode from a high frequency voltage source, and etching is performed for a time determined by which one layer of the layers 2 can be etched from the sample surface. Then, while changing the etching gas by $CCl_4$, the layer 3 is etched. These operations are repeated alternately three times, and the alternate accumulation film is etched with a width of 1 micron, so that, as shown in FIG. 3, the second etching stopper layer 4 is completely exposed or uncovered. By this procedure, as shown in 3, the patterning and etching to the fourth level (step) from the top, which corresponds to the bottom step, is completed. The sample is then taken out of the etching apparatus, and the resist 5 is removed. As shown in FIG. 4, a photoresist 5 is formed again on the alternate accumulation film by using a spinner. Then, in this case, a step width of 2 microns, corresponding to the second level (step), plus a patterning alignment precision of 0.3 microns, thus a total width of 2.3 microns, is exposed and developed. Here, the 0.3 micron width is set at the etching stopper layer side as already having been exposed by the etching.

Like the preceding operation, the sample is loaded on the etching apparatus and, as shown in FIG. 5, the etching operation is performed for a predetermined time so that one of the layers 2 is etched. Similarly, while changing the etching gas, a layer 3 is etched. The sample is unloaded from the etching apparatus, and the resist 5 is removed. Subsequently, like the preceding operation, a photoresist 5 is formed on the alternate accumulation film by using a spinner, as shown in FIG. 6. Then, a step width of 1 micron, corresponding to the third level (step), plus a patterning alignment precision of 0.3 microns, thus a total width 1.3 microns, is exposed and developed. Here, the 0.3 micron width is set again at the etching stopper layer side as already having been exposed by the etching.

Figure 7:
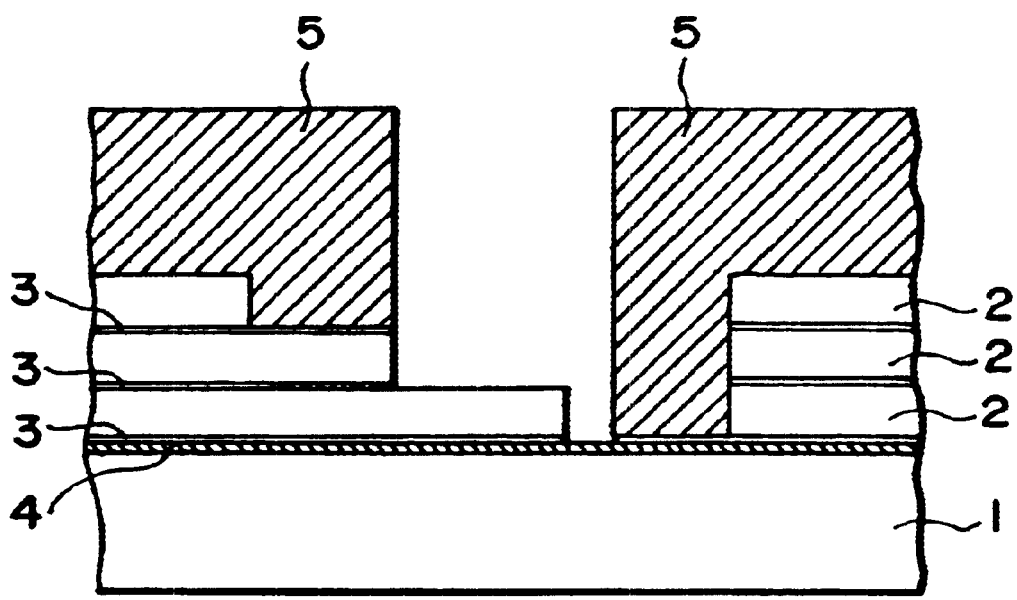

Further, like the preceding operation, the sample is loaded on the etching apparatus, and, as shown in FIG. 7, etching is performed for a predetermined time so that one layer of the layers 2 is etched.

Similarly, while changing the etching gas, the layer 3 is etched. Then, the sample is unloaded from the etching apparatus, and the resist 5 is removed. Subsequently, the sample having been etched is placed in a $Cr_2O_3$ removing liquid and, with the application of ultrasonic waves, only the second etching stopper layer 4 is removed. The second etching stopper layer 4, having been roughened by the etching of the second and third steps, is thus removed, whereby a smooth surface of the substrate 1 is exposed at the bottom of a groove. After this, it is sufficiently cleaned with washing with pure water, and then it is dried by using a $N_2$ blower, whereby a four-level diffractive optical element, such as shown in FIG. 1, is completed.

If an Al reflection surface is formed at this diffraction grating surface by using an ordinary vacuum deposition apparatus, a four-level reflection type diffractive optical element can be produced.

In accordance with the method of this embodiment, a side wall facing a step or steps can be made perpendicular to the bottom face, as illustrated, and the etching bottom face is not roughened. Also, the produced shape is rectangular with every step having a smooth surface and with regular level differences. Therefore, a diffractive optical element having superior diffraction can be produced at low cost and with stability. Here, it is to be noted that the sputtering film 2 or etching stopper film 3, constituting the steps, is not limited to the combination of materials described in this embodiment. Other materials may be used with similar advantageous effects.

Figure 8:
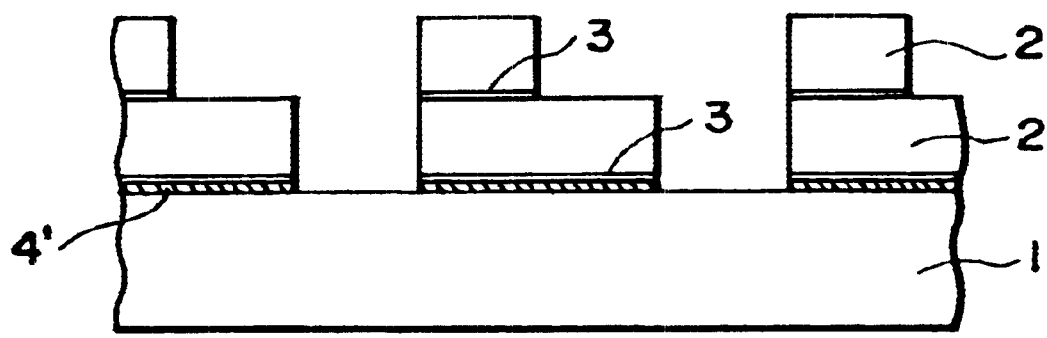
FIG. 8 is a sectional view of a diffractive optical element according to a second embodiment of the present invention.

FIG. 8 is a sectional view of a second embodiment. The $Cr_2O_3$ film used in the first embodiment as the second etching stopper film 4 is replaced by a metal Cr film, and a sample is processed by annealing using a heating high-temperature oven, in a $N_2$ atmosphere, at 400 degrees and for two hours. Onto this second etching stopper layer 4, a first etching stopper layer 3 of $Al_2O_3$ film and a sputtering film (etching layer) 2 of $SiO_2$ film, constituting each step, are alternately accumulated twice. Through corresponding photolithographic processes and etching processes, a diffractive optical element can be produced. The remaining portion of this embodiment is similar to the first embodiment.

In this manner, like the first embodiment, a three-level reflection type diffractive optical element of rectangular shape, having a side wall perpendicular to the bottom face and having smooth and regular steps, without roughened faces, can be completed. By using the second etching stopper layer 4 of metal Cr film, a reflection factor similar to that of a substrate 1 of Si wafer to be used in an ordinary photolithographic process, can be obtained. Therefore, usual exposure conditions can be applied and thus the production can be smoothly switched. It is to be noted that similar advantageous effects are attainable with a diffractive optical element having levels other than those described above.

Further, in the first embodiment, the substrate 1 of Si wafer may be changed by a quartz wafer, and an anti-reflection film, not an Al reflection film, may be formed on the etched diffraction grating surface by using an ordinary vacuum deposition apparatus. It can produce a fourlevel transmission type diffractive optical element, having similar characteristics as in the first embodiment. Also, similar advantageous effects are attainable with use of a transparent optical material other than quartz.

Further, in the first embodiment, an etching layer 2 may be directly formed on the second etching stopper layer 4, without forming the etching stopper layer 3, and, through subsequent alternate accumulation with the etching stopper layer 3 as in the first embodiment, a four-level diffractive optical element may be produced. In that case, an Al reflection film is not formed on the diffraction grating surface, and, as a mold, an ultraviolet radiation setting resin is dropped thereon and an optical glass is adhered thereon. The the resin is set through a projection of ultraviolet rays from the bottom face or the top face of the diffraction grating, and thereafter, it is removed and replica-transferred, whereby a diffraction grating is produced. Alternatively, a thermo-plastic resin may be injected into a mold, and a diffraction grating can be produced by injection molding. Also, an Al reflection film may be formed on the grating surface of the thus produced diffraction grating, by which a reflection type diffractive optical element can be produced. In that case, a four-level reflection type diffractive optical element having similar characteristic as in the first embodiment can be manufactured with good reproducibility and at lower cost.

When, in the first embodiment, the diffractive optical element is produced by alternately accumulating the etching stopper layers 3 and the etching layers 2 directly upon the substrate 1, without provision of the second etching stopper layer 4, a small groove may be formed at the groove portion corresponding to the fourth step from the top, that is, at the lowest step or the bottom face may be roughened. However, the side wall facing the step or steps can be perpendicular to the bottom.

Further, in the first embodiment, the annealing process is performed after the formation of the second etching stopper layer 4. This is to reduce or avoid the possibility that a portion of the film may otherwise be separated during the formation of the alternate accumulation film or the property of the film may otherwise change locally on the surface of the substrate 1, causing a difficulty in accomplishing the desired patterning, or film separation may otherwise occur during the resist removing operation or a washing operation in the photolithographic process.

When, in the first embodiment, an Al reflection film is formed on the diffraction grating surface to provide a reflection type diffractive optical element, after completion of the etching of the first etching stopper layer 3, the second etching stopper layer 4 is removed by wet etching. This prevents roughening of the the surface of the lowest step, corresponding to the fourth step from the top.

Referring now to FIGS. 9–22, a third embodiment of the present invention will be described in detail.

Figure 9:
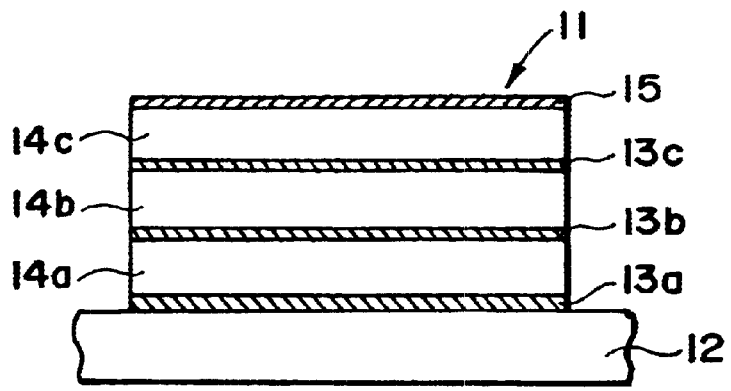

FIGS. 9–22 are sectional views for explaining the manufacturing processes for a diffractive optical element having a step-like shape like in the first embodiment. FIG. 9 illustrates an accumulation film 11 prior to the etching process. A substrate 12 comprising a Si wafer 8 inches in diameter and having been cleaned, is placed on a sample holder so that the film forming surface thereof faces a target of a sputtering apparatus (not shown). After the casing of the sputtering apparatus is vacuum evacuated sufficiently, the sample 12 is heated uniformly at 300° C., and an oxygen gas and an argon gas of the even quantity are supplied into the casing, with a set pressure of 2 Pa. Then, a high frequency wave with an output of 800 W is applied to the Al target by using a RF voltage source, whereby an auxiliary film of $Al_2O_3$ film 13a, which functions as an etching taper adjusting layer is uniformly formed on the substrate 12, with a thickness of about 15 nm.

Subsequently, without releasing the vacuum in the casing, the Al target is replaced by a $SiO_2$ target while the mixture ratio of the oxygen gas and the argon gas in the casing is adjusted to 1:10, and a $SiO_2$ film 14a, which is a main film constituting the main portion of the step-like shape, is formed on the $Al_2O_3$ film 13a, with a thickness of about 600 nm.

The above-described process is repeated twice, whereby $Al_2O_3$, films 13b and 13c of thicknesses of about 45 and 36 microns and $SiO_2$ films 14b and 14c of thicknesses of about 570 and 579 microns are alternately accumulated on the substrate 12, in this order from the substrate side. Thus produced accumulation film 1 is unloaded from the sputtering apparatus, after an atmosphere is introduced into the casing, following the cooling.

To the accumulation film 1 unloaded out of the sputtering apparatus, an annealing process is performed inside a heating high-temperature oven at 450° C. for about two hours. Then, it is placed in a vacuum deposition apparatus so that it is opposed to a chromium evaporation source. After sufficiently vacuum evacuating the inside space of a casing of the vacuum deposition apparatus, the accumulation film 1 is uniformly heated to 300° C., and chromium is heated by using an electron gun. By this, a chromium film of a thickness of about 35 nm is deposited as a mask on the $SiO_2$ film 14c at the topmost step. After it is cooled sufficiently and an atmosphere is introduced into the casing, the accumulation film 11 is unloaded out of the vacuum deposition apparatus.

While this embodiment uses a chromium film 15 as a mask having a different reactivity to an etching gas to be used for the etching of the $Al_2O_3$ film and $SiO_2$ film 14, any other metal thin film, dielectric material film or synthetic resin may be used.

Figure 10:
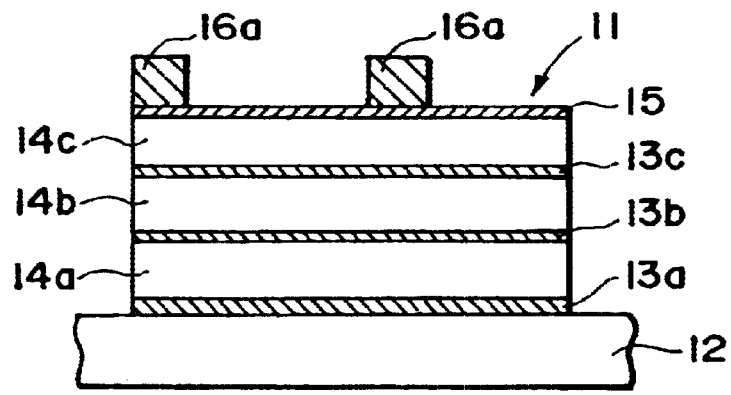

FIG. 10 shows a photoresist 16a formed on the chromium film 15, being patterned as desired. In this embodiment, a spinner is used to apply a photoresist 16a of a 1 micron thickness onto the chromium film 15 surface, in the form of a line-and-space pattern of a 4-micron pitch and 3-micron opening. This patterning is formed by exposure and development processes to the resist according to known methods.

Figure 11:
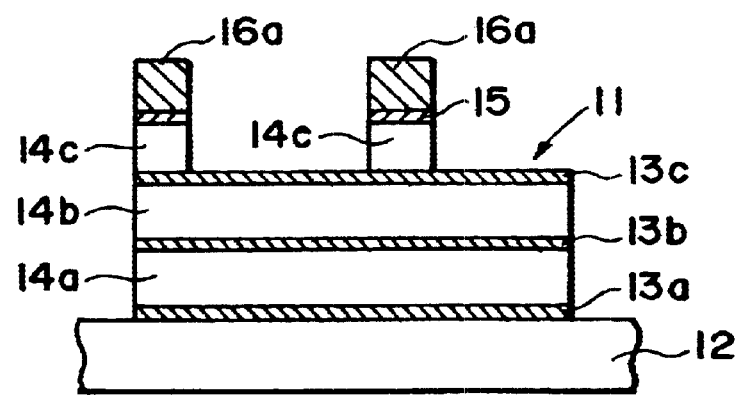

Subsequently, as shown in FIG. 11, the exposed or uncovered portion of the chromium film 15 is placed in a chromium removing liquid, whereby it is removed by wet etching. Then, the accumulation film 11 is placed on an electrode of a RIE etching apparatus, so that the film forming surface can be etched. After vacuum evaluation of the casing, an etching gas of $CF_4$ and $CHF_3$ is introduced into the casing, forcast and the pressure is set to 1 Pa. Thereafter, an output of 100 W is applied to the electrode from a high-frequency voltage source. By the electric discharging, the exposed portion of the $SiO_2$ film 14c is etched. After checking the etching process through plasma measurement, the $Al_2O_3$ film 13c, which functions as a taper adjusting layer, is etched for a predetermined time necessary for the side wall of the $SiO_2$ film 14c to become perpendicular to the substrate surface.

Figure 12:
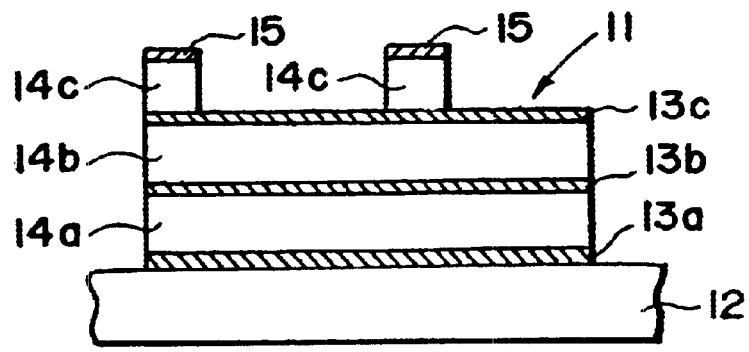
Figure 13:
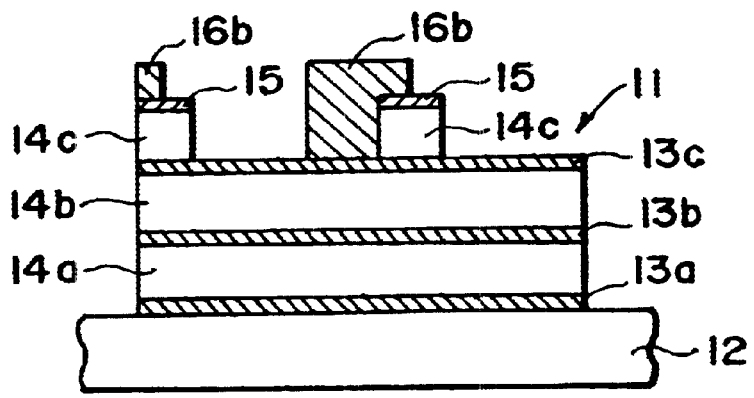

Then, the atmosphere is introduced into the casing and the accumulation film 1 is unloaded, and the photoresist 16a is removed as shown in FIG. 12. Subsequently, as shown in FIG. 13, by using a spinner, a photoresist 16b of line-and-space with 4-micron pitch and 2-micron opening is patterned on the etched surface, and exposure and development processes are performed. In order to cancel any deviation of alignment, the photoresist 16b on the chromium film 15 is patterned so that its edge is inside the chromium film 15. However, in this embodiment, any tilt of the side wall portion or any surface waviness to be produced in the photoresist 16 is canceled.

Figure 14:
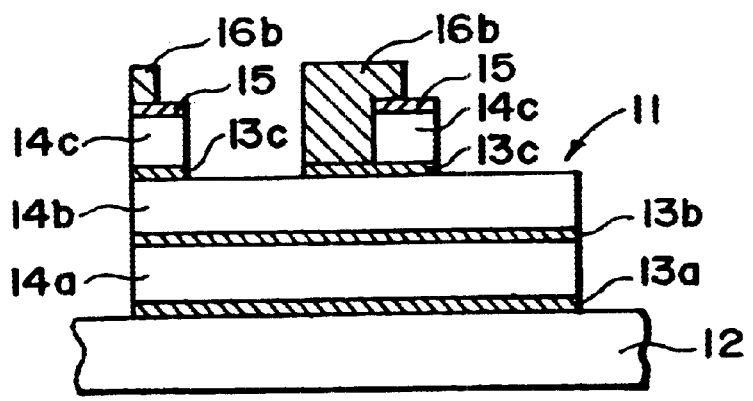
Figure 18:
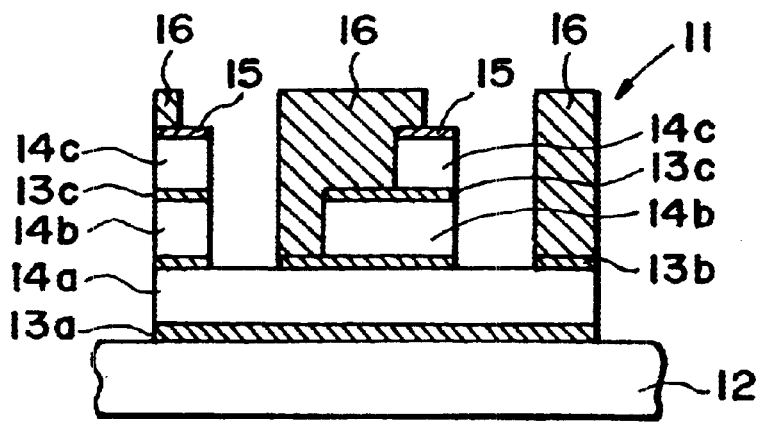
Figure 19:
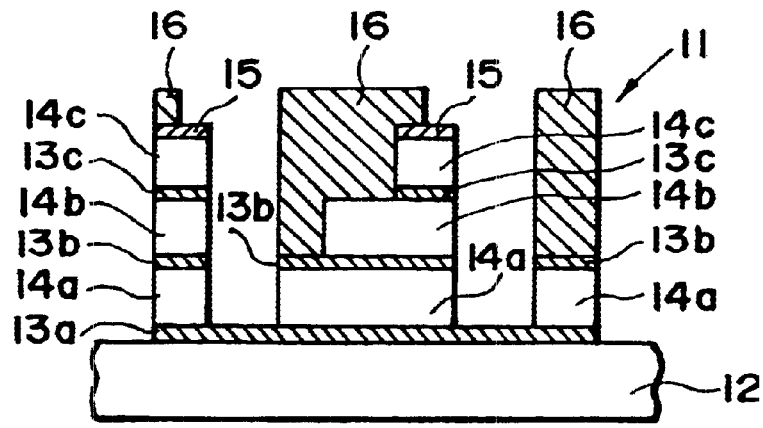
Figure 20:
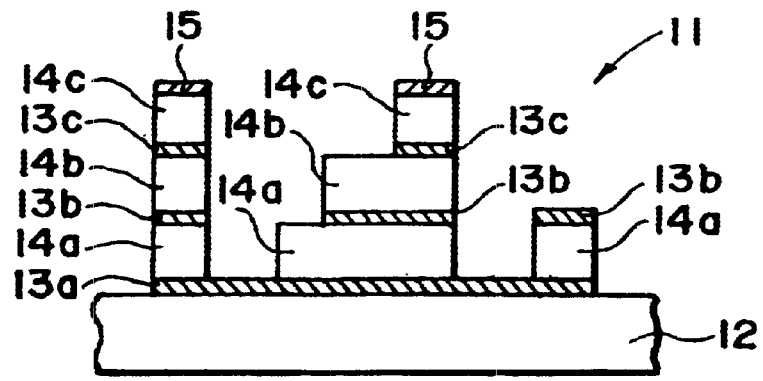

Subsequently, as shown in FIG. 14, the exposed portion of the $Al_2O_3$ film 13c is removed by wet etching, so that it functions as an etching mask for the $SiO_2$ film 14b.

In FIGS. 15–20, by using the above-described processes, the sample is set in a RIE etching apparatus and the etching, resist separation and patterning of the $SiO_2$ film 14 corresponding to the second step of the step-like structure and below, as well as the wet etching of the $Al_2O_3$ film 13, are performed.

With the provision of an alternate accumulation film having $Al_2O_3$ films (auxiliary films) 13 having different thicknesses at different steps, even if a tilt portion of the photoresist 16 caused by the patterning is retracted by the etching, since the etching rate of the $Al_2O_3$ film 13 below the photoresist 16 is considerably slow as compared with the $SiO_2$ film 14 and the photoresist 16, it functions well as a mask. By making the film thickness of the $Al_2O_3$ film 13 to be at its minimum value, in consideration of the level difference of the steps, pattern size or the magnitude of tilt of patterning, which varies with the material of the photoresist or the amount of exposure, for example, or the time necessary for etching the $SiO_2$ film 14 at each step to a desired depth, the side wall of the $SiO_2$ film 14 is etched perpendicularly to the substrate surface.

Even if any tilt is produced in the $SiO_2$ film 14 in the etching operation, since the etching rate of the $Al_2O_3$ film 13 below is very slow as compared with the $SiO_2$ film 14 and the photoresist 16, it functions well as a taper adjusting layer. To this end, the film thickness of the $Al_2O_3$ film 13 is set at a minimum value to meet the correction of the etching tilt amount of the $SiO_2$ film 14, which differs with steps, and by this, the side wall of the $SiO_2$ film 14 is etched perpendicularly to the substrate surface.

After exposure and development of a desired patterning, the $Al_2O_3$ film 13 is etched so that the main surface below it is uncovered and, subsequently, the $SiO_2$ film 14 is etched. The $Al_2O_3$ film 13 having been thus patterned as desired is then used as a mask for the underlying $SiO_2$ film 14. As a result, the side wall of the underlying $SiO_2$ film 14 can be etched perpendicularly to the bottom surface.

Figure 21:
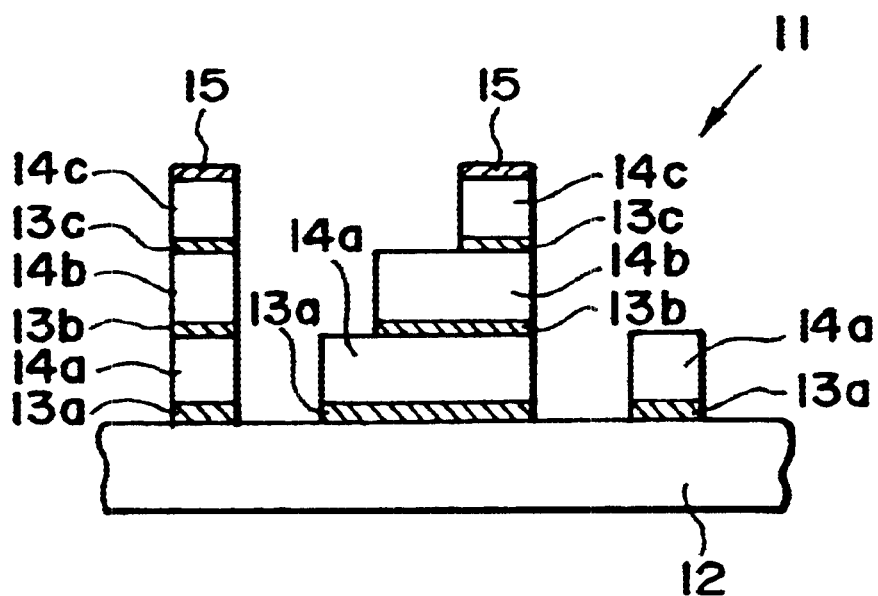
Figure 22:
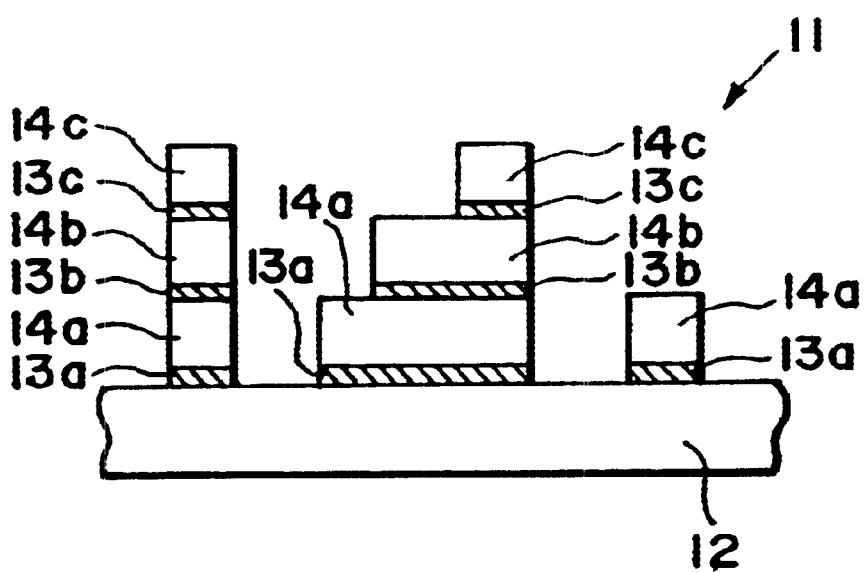

Also, as shown in FIG. 21, for an $Al_2O_3$ film 13 having been damaged by the etching, only its exposed portion may be removed by wet etching so that a smooth and flat $SiO_2$ film 14 is exposed. Subsequently, as shown in FIG. 22, a chromium film 15 damaged by the etching may be removed by wet etching, so that a smooth and flat $SiO_2$ film 14 is exposed. By doing so, a four-level diffractive optical element of rectangular shape, having uniform level difference and having a side wall facing the step extending perpendicularly to the bottom surface, can be produced.

In this embodiment, while not shown in the drawings, an Al reflection film may be formed on the diffraction grating surface of a four-level diffractive optical element thus produced, by using a vacuum deposition apparatus. Thus, a reflection type diffractive optical element can be manufactured.

As a fourth embodiment, without forming the $Al_2O_3$ film 13a, which is an auxiliary film on the substrate 12 in the third embodiment, the $SiO_2$ film 14 (main film) may be directly formed on the substrate 12. In that occasion, the number of accumulated layers for the $SiO_2$ film may be increased from three layers to seven layers, and the thicknesses of the $SiO_2$ films 4 may be set to 263 nm, 233 nm, 239 nm, 243 nm, 244 nm, 246 nm, and 246 nm, respectively, in an order from the substrate 12 side. Also, the thicknesses of $Al_2O_3$ films 13 formed on the $SiO_2$ film 14 may be set to 30 nm, 24 nm, 20 nm, 19 nm, 17 nm, and 17 nm, respectively, in an order from the bottom $SiO_2$ layer.

The $Al_2O_3$ film 13 at each layer is not wet etched, but is dry etched in a RIE etching apparatus as the $SiO_2$ film 14, while using a $CCl_2$ etching gas and while performing a plasma measurement. The remaining processes may be similar to those of the third embodiment.

Even if the $SiO_2$ film 14 on the substrate 12 (Si wafer) is formed directly, since Si has a different reactivity to the etching gas of the $SiO_2$ film 14, it functions well as a taper adjusting layer.

The diffractive optical element produced in the manner described above has uniform level differences among the steps like those of the third embodiment, and its step-like like sectional shape, particularly, the side wall facing the step, is perpendicular to the bottom face. Thus, an eightlevel reflection type diffractive optical element of rectangular shape can be accomplished.

One layer of $Al_2O_3$ film 13 may be omitted. This is effective to reduce the overall stress of the accumulation film 11, such that an eight-level alternate accumulation film having a large contact force to the substrate 12 can be provided. Therefore, a diffractive optical element having a high diffraction efficiency can be produced.

With regard to the $SiO_2$ film 14, the $Al_2O_3$ film 13 and the chromium film 15, similar advantageous results are attainable with a combination of other materials. For example, a $SiO_2$ film and a chromium film may be used as a main film and a mask, respectively, as in the present embodiment, while the same silicon material as the substrate 12 may be used as an auxiliary film. In that case, a CF4 gas may be used for the etching of this auxiliary film to increase the etching selection ratio of $SiO_2$ to Si, to remove the same by etching. Thus, a similar diffractive optical element can be produced.

As a fifth embodiment, the $SiO_2$ film 14 in the third embodiment may be replaced by an Al film, the $Al_2O_3$ film 13 may be replaced by a Cu film, and the chromium film 5 may be replaced by a Mo film, respectively, and an accumulation film may be formed on the substrate 12 using those films. The Al film may be dry etched by using an etching gas, while the Cu film and Mo film may be removed by wet etching by using respective etching liquids.

In the accumulation film 11, since all the materials constituting the film use metal films having high film forming speeds, the productivity is good.

As a sixth embodiment, a quartz substrate may be used in place of the substrate 2 (Si wafer) used in the third embodiment. An anti-reflection film, in place of the Al reflection film, may be formed on the diffraction grating surface of the produced diffractive optical element by using a vacuum deposition apparatus. A transmission type diffractive optical element having good diffraction can thereby be produced. Further, any transparent optical material other than quartz may be used.

The $Al_2O_3$ film 3 may be replaced by a $Si_3N_4$ film, with thicknesses of 15 nm, 600 nm, 35 nm, 580 nm, 25 nm and 590 nm, in an order from the substrate 12 side, which may be formed into an alternate accumulation film of $SiN_3$ layers and $SiO_2$ layers. An oxygen gas may be added, as an additive gas, to a CF₃Br etching gas, and the etching process may be performed while executing a plasma measurement. A good diffractive optical element can thereby be produced.

As a seventh embodiment, without forming the Al reflection film on the diffraction grating surface of the four-level diffractive optical element in the third embodiment, the produced diffractive optical element may be used as a mold. A ultraviolet-radiation setting resin may be dropped onto this diffractive optical element, and an optical glass may be adhered thereon. An ultraviolet radiation may be projected to the diffractive optical element, from its bottom face side or top face side, to set the resin. After this, the resin may be separated, whereby a diffractive optical element of replica transferred can be produced. An Al reflection film may be formed on the diffraction grating surface of the schematic view, by which a reflection type diffractive optical element is produced.

The reflection type diffractive optical element thus produced has uniform level difference among the steps similar to the first embodiment. Additionally, reflection type diffractive optical elements can be produced with good reproducibility and at lower cost.

As an eighth embodiment, a mold as produced in the seventh embodiment may be attached to an injection molding apparatus, and, while using a transparent thermo-plastic resin, a substrate 12 and a diffractive optical element may be formed as a unit, through the molding. Anti-reflection films may be formed by deposition on the surface of the diffractive optical element and the bottom face of the substrate. A transmission type diffractive optical element being integral with the substrate 12 can be produced.

The diffractive optical element thus produced has uniform level differences at its steps. Also, a transmission type diffractive optical element can be produced with a good productivity and a good reproducibility, and at lower cost.

Such diffractive optical element may be used as a color separation filter in an image reading apparatus or a liquid crystal projector, and it may be used as a diffraction lens in a photographing optical system or a projection optical system.

If, in the diffractive optical element, the thicknesses of the Al₂O₃ film layers 13a, 13b and 13c are not optimized but they are all equal to a largest thickness of 45 nm, the contact force to the substrate 12 is low, and surface deformation may occur due to local film floating. Also, since the Al₂O₃ film layers 13a, 13b and 13c are removed three times by wet etching, lateral elongation may occur at the end portion of the topmost Al₂O₃ film layer 13c. Thus, a step-like diffractive optical element having a high-precision rectangular shape can not be accomplished. Further, the film forming time is very prolonged, and the productivity is low. Additionally, with regard to the diffraction spectral characteristic of the produced diffractive optical element, the reflectivity is low and a desired spectral characteristic is not attainable.

In the third embodiment described above, after the etching with SiO₂ film 14, the patterning with the photoresist 16 is performed. This is due to the fact that if the patterning with the photoresist 16 is performed after the Al₂O₃ film is removed, in the produced diffractive optical element, the edge of the photoresist 16 may be retracted during the etching process for the SiO₂ film 14, such that a tilt may be produced at the side wall of the SiO₂ film 14, like the photoresist 16. In that case, a step-like diffractive optical element having a desired rectangular shape is not attainable.

While the invention has been described with reference to the structures disclosed herein, it is not confined to the details set forth and this application is intended to cover such modifications or changes as may come within the purposes of the improvements or the scope of the following claims.

What is claimed is:

1. A method of manufacturing a structure arraying a plurality of step-like elements each having at least three steps, said method comprising the steps of:

etching, using a first resist pattern, a first region of a film comprising multiple layers having different etching rates formed on a substrate, corresponding to lowest steps of the step-like elements, to a first depth, whereby surfaces of the lowest steps of the step-like elements are defined; and etching, subsequently, using a second resist pattern different from the first resist pattern, a second region of the film, corresponding to other steps of the step-like elements, to a second depth, whereby surfaces of these said steps of the step-like elements are defined, wherein side walls of the step-like elements are covered with the second resist pattern during the etching of the second region.

2. The method according to claim 1, wherein a thickness of the film corresponds to the height of the step-like elements.

3. A method according to claim 2, wherein the film includes a multilayered film comprising alternate layers of two materials having different etching rates, and wherein each layer of one of the two materials having a higher etching rate serves as a main portion of the step-like elements while each layer of the other material having a lower etching rate serves as a stopper when each layer of the material of the higher etching rate is etched.

4. A method of manufacturing a diffractive optical element, including:

forming a mold in accordance with the method as recited in claim 1;

filling the mold with an UV curable resin;

curing the resin; and removing the cured resin from the mold.

5. A method of manufacturing a diffractive optical element, including:

forming a mold in accordance with the method as recited in claim 1; and injecting a thermoplastic resin into the mold.

6. The method according to claim 1, wherein a lowest layer of the multiple layers has an etching rate smaller than that of the remaining layers.

7. A method according to claim 6, wherein a deep groove connecting the second etching stopper layer is formed by etching and, subsequently, shallow groove corresponding to steps of the step-like shape are defined by etching, sequentially from the top of the accumulation film.

8. A method according to claim 7, wherein an annealing operation is performed after the second etching stopper layer is formed.

9. A method according to claim 6, wherein the second etching stopper layer as exposed by the formation of the step-like shape, is removed by etching.

10. A method of manufacturing an optical system having an optical element comprising:

forming the optical element according to a method recited in claim 6;

filling the element with resin;

curing the resin; and removing the cured resin from the element.

11. A method of manufacturing a structure arraying a plurality of step-like elements each having at least three steps, said method comprising the steps of:

forming, on a substrate, a film having a thickness corresponding to the height of the step-like elements;

etching, using a first resist pattern, a first region of the film on the substrate, corresponding to lowest steps of the step-like elements, to a first depth, whereby surfaces of the lowest steps of the step-like elements are defined; and etching, subsequently, using a second resist pattern different from the first resist pattern, a second region of the film on the substrate, corresponding to other steps of the step-like elements, to a second depth, whereby surfaces of these said steps of the step-like elements are defined, wherein the film includes a multilayered film comprising alternate layers of two materials having different etching rates, wherein each layer of one of the two materials having a higher etching rate serves as a main portion of the step-like elements while each layer of the other material having a lower etching rate serves as a first stopper layer when the or each layer of the material of the higher etching rate is etched, wherein the film further includes a second stopper layer of a material having an etching rate lower than those of the two materials and being provided on a side of the multilayered film facing the substrate, the second stopper layer serving as a stopper when the two materials are etched, and wherein side walls of the step-like elements are covered with the second resist pattern during the etching of the second region.

12. A method of manufacturing a structure arraying a plurality of step-like elements each having at least three steps, said method comprising the steps of:

etching, using a first resist pattern, a first region of a substrate, corresponding to lowest steps of the step-like elements, to a first depth, whereby surfaces of the lowest steps of the step-like elements are defined; and etching, subsequently, using a second resist pattern different from the first resist pattern, a second region of the substrate, corresponding to other steps of the step-like elements, to a second depth, whereby surfaces of these said steps of the step-like element are defined, wherein side walls of the step-like elements are covered with the second resist pattern during the etching of the second region.

* * * * *

UNITED STATES PATENT AND TRADEMARK OFFICE
CERTIFICATE OF CORRECTION

PATENT NO. : 6,670,105 B2
DATED : December 30, 2003
INVENTOR(S) : Junji Terada et al.

It is certified that error appears in the above-identified patent and that said Letters Patent is hereby corrected as shown below:

Title page,
Item [*], Notice, insert -- This patent issued on a continued prosecution application filed under 37 CFR 1.53(d), and is subject to the twenty year patent term provisions of 35 U.S.C. 154(a)(2). --.

Column 2,
Line 13, "a film." should read -- a film --; and
Line 67, "a" should read -- a --.

Column 3,
Lines 22 and 42, "rage" should read -- rate --.

Column 4,
Line 5, "eights" should read -- eighth -- .

Column 6,
Line 66, "fourlevel" should read -- four-level --.

Column 10,
Line 5, "246 nm," (first occurrence) should be deleted; and
Line 8, "17 nm," (first occurrence) should be deleted.

Signed and Sealed this

Thirteenth Day of July, 2004

JON W. DUDAS
*Acting Director of the United States Patent and Trademark Office*